US011832376B1

(12) United States Patent
Sclafani, Jr.

(10) Patent No.: US 11,832,376 B1
(45) Date of Patent: Nov. 28, 2023

(54) FOLD AWAY BLANKING PANEL SYSTEM

(71) Applicant: Equinix, Inc., Redwood City, CA (US)

(72) Inventor: Anthony F. Sclafani, Jr., Millstone Township, NJ (US)

(73) Assignee: Equinix, Inc., Redwood City, CA (US)

( * ) Notice: Subject to any disclaimer, the term of this patent is extended or adjusted under 35 U.S.C. 154(b) by 0 days.

(21) Appl. No.: 17/445,936

(22) Filed: Aug. 25, 2021

Related U.S. Application Data

(60) Provisional application No. 63/071,885, filed on Aug. 28, 2020.

(51) Int. Cl.
*H05K 5/02* (2006.01)
*H05K 7/20* (2006.01)
*H05K 5/03* (2006.01)

(52) U.S. Cl.
CPC ......... *H05K 5/0286* (2013.01); *H05K 5/0208* (2013.01); *H05K 5/0226* (2013.01); *H05K 5/03* (2013.01); *H05K 7/20736* (2013.01)

(58) Field of Classification Search
CPC ....................................................... H05K 5/00
See application file for complete search history.

(56) References Cited

U.S. PATENT DOCUMENTS

| | | | |
|---|---|---|---|
| 5,559,672 A * | 9/1996 | Buras, Jr. .............. | G06F 1/1616 439/138 |
| 8,052,231 B2 | 11/2011 | Rasmussen et al. | |
| 2011/0113691 A1* | 5/2011 | Chang ..................... | G06F 1/181 49/109 |

OTHER PUBLICATIONS

"2U Hinged Solid Blank Rack Panel," retrieved from https://www.startech.com/en-us/server-management/rkpnlhs2u, on Dec. 9, 2021, 5 pp.
"Hinged Solid Server Rack Blanking Panel," Instruction Manual, Startech.com, Mar. 5, 2015, 2 pp.

* cited by examiner

*Primary Examiner* — Jerry Wu
(74) *Attorney, Agent, or Firm* — Shumaker & Sieffert, P.A.

(57) ABSTRACT

In some examples, a system including a first blanking panel and a second blanking panel configured to be affixed to a cabinet. The first blanking panel includes a first spring-loaded hinge and a first connecting mechanism. The second blanking panel includes a second spring-loaded hinge and a second connecting mechanism. Each of the first and second spring-loaded hinges are configured to rotate between a non-deployed position and a deployed position. Each of the first and second connecting mechanisms are configured to connect the first blanking panel with the second blanking panel in a closed position when the spring-loaded hinges are in the non-deployed position. The first blanking panel and the second blanking panel are configured to be out of contact with each other and into respective open positions when the spring-loaded hinges are in the deployed position.

20 Claims, 9 Drawing Sheets

FOLD AWAY BLANKING PANEL SYSTEM

This application claims the benefit of U.S. Provisional Patent Application No. 63/071,885, filed 28 Aug. 2020, the entire contents of which is incorporated herein by reference.

TECHNICAL FIELD

The disclosure relates to data centers, and more specifically, to equipment within a data center facility.

BACKGROUND

A facility such as a data center includes a data center storage space storing numerous electronic devices that produce heat, including network, server, and storage gear, as well as power distribution units for distributing power to devices within the facility. A cooling unit may be used to supply a cool air stream into the storage volume. Warm exhaust produced by electronic devices within the storage volume may be returned to the cooling unit as return air for cooling and recirculation within the storage volume. This return, cooling, and recirculation of air within the facility may help to keep the air within the storage volume cool to maintain safety, performance, and reliability of the electronic devices within the storage volume.

SUMMARY

In general, the disclosure describes fold away blanking panel systems. The fold away blanking panel systems may be affixed to cabinets in a data center storage space. Slots of the cabinets may be configured to receive a device, such as an electronic device. Unoccupied slots in cabinets may create airflow issues within the data center that may reduce the efficiency of cooling the data center storage space.

The fold away blanking panel system includes a first blanking panel and a second blanking panel configured to be affixed to infrastructure in a data center colocation space, such as a server cabinet. The first and second blanking panels are affixed to the infrastructure in a manner that would obscure air access to the infrastructure when the blanking panels are in a closed position, yet enable access to the infrastructure and concurrent installation of electronic devices when the blanking panels are in respective open positions. When an electronic device is inserted into the infrastructure, the first and second blanking panels fold away and are configured to be held in open positions. When the electronic device is removed, the first and second blanking panels fold out and revert from the open positions to the closed position to block airflow access. The fold away blanking panel system may avoid a need to entirely remove blanking panels to install or remove electronic devices, and may improve data center cooling efficiency.

In one example, a system includes a first blanking panel and a second blanking panel configured to be affixed to a cabinet. The first blanking panel includes a first spring-loaded hinge and a first connecting mechanism. The second blanking panel includes a second spring-loaded hinge and a second connecting mechanism. Each of the first and second spring-loaded hinges is configured to rotate between a non-deployed position and a deployed position. When the spring-loaded hinges are in the non-deployed position, the first and second connecting mechanisms are configured to connect the first blanking panel with the second blanking panel in a closed position. When the spring-loaded hinges are in the deployed position, the first blanking panel and the second blanking panel are configured to be out of contact with each other and into respective open positions.

In another example, a system includes a cabinet and one or more pairs of blanking panels. Each pair of blanking panels of the one or more pairs of blanking panels includes a first blanking panel and a second blanking panel affixed to the cabinet. The first blanking panel includes a first spring-loaded hinge and a first connecting mechanism. The second blanking panel includes a second spring-loaded hinge and a second connecting mechanism. Each of the first and second spring-loaded hinges is configured to rotate between a non-deployed position and a deployed position. When the spring-loaded hinges are in the non-deployed position, the first and second connecting mechanisms are configured to connect the first blanking panel with the second blanking panel in a closed position. When the spring-loaded hinges are in the deployed position, the first blanking panel and the second blanking panel are configured to be out of contact with each other and into respective open positions.

In a further example, a system includes a data center storage space containing a plurality of cabinets, and each cabinet of the plurality cabinets includes one or more pairs of blanking panels. Each pair of blanking panels of the one or more pairs of blanking panels includes a first blanking panel and a second blanking panel. The first blanking panel includes a first spring-loaded hinge and a first connecting mechanism. The second blanking panel includes a second spring-loaded hinge and a second connecting mechanism. Each of the first and second spring-loaded hinges is configured to rotate between a non-deployed position and a deployed position. When the spring-loaded hinges are in the non-deployed position, the first and second connecting mechanisms are configured to connect the first blanking panel with the second blanking panel in a closed position. When the spring-loaded hinges are in the deployed position, the first blanking panel and the second blanking panel are configured to be out of contact with each other and into respective open positions.

In yet another example, a method includes installing a first blanking panel configured to be affixed to a cabinet, wherein the first blanking panel comprises a first spring-loaded hinge and a first connecting mechanism. The method further includes installing a second blanking panel configured to be affixed to the cabinet, wherein the second blanking panel comprises a second spring-loaded hinge and a second connecting mechanism, wherein the first and second connecting mechanisms are configured to connect the first blanking panel with the second blanking panel in a closed position when the first and second spring-loaded hinges are in a non-deployed position. The method further includes inserting an electronic device between the first blanking panel and the second blanking panel, wherein each of the first and second spring-loaded hinges is configured to rotate from the non-deployed position to a deployed position in response to insertion of the electronic device, wherein the first blanking panel and the second blanking panel are configured to be out of contact with each other and into respective open positions when the first and second spring-loaded hinges are in the deployed position, and affixing the electronic device to the cabinet while the first blanking panel and the second blanking panel remain affixed to the cabinet and in the respective open positions.

The details of one or more examples are set forth in the accompanying drawings and the description below. Other features, objects, and advantages of the disclosure will be apparent from the description and drawings, and from the claims.

BRIEF DESCRIPTION OF DRAWINGS

Like reference characters denote like elements throughout the figures and text.

DETAILED DESCRIPTION

Figure 1:
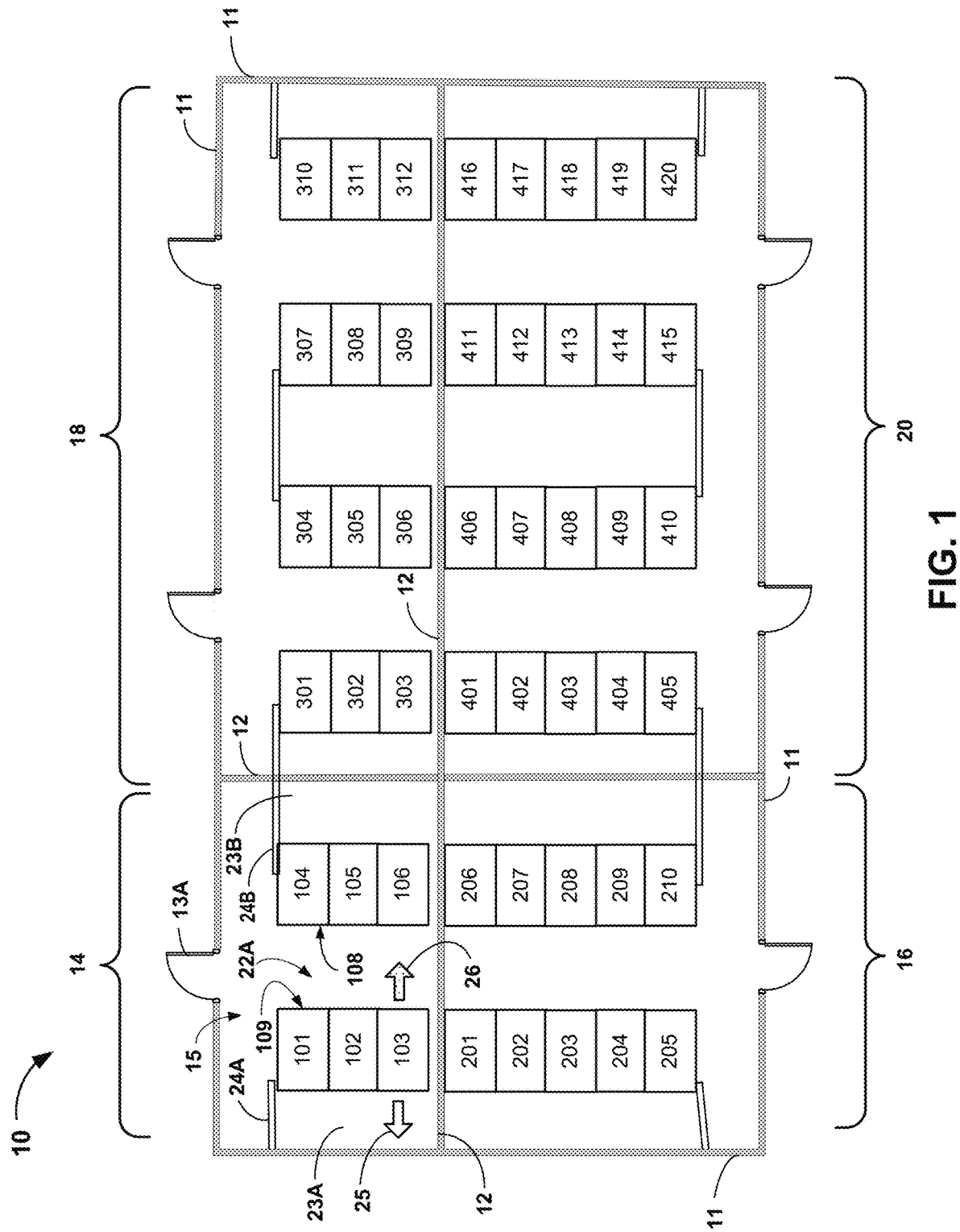
FIG. 1 illustrates a plan view of a data center storage space including fold away blanking panel systems in accordance with one or more example techniques of the disclosure.

A data center may house numerous electronic devices that produce heat, including network, server, and storage gear, as well as power distribution units (PDUs) for distributing power to devices within the facility. In some examples, the data center may employ a horizontal cooling air supply system for cooling electronic devices within the data center. Servers and other equipment housed in server cabinets may pull cool air from streams of cool air in relatively cooler "cold aisles" as needed and discharge warm server exhaust into contained "hot aisles" that are relatively hotter. The warm server exhaust may be returned to a cooling unit as return air for cooling and recirculation in cool airstreams in the cold aisles.

The hot aisles are generally separated from the cold aisles by physical structures such as walls and/or airway that may be designed to direct the cold air to a front side of the server cabinets, and remove and/or recirculate the hot air that is normally expelled from a backside of the server cabinets into one or more hot aisles. Most server cabinets comprise a series of slots, each slot designed to receive a piece of electronic equipment (e.g., an electronic device). Thus, a given server cabinet may house a plurality of electronic devices, and when these electronic devices are installed in the slots of the server cabinet, they substantially seal the area of the slot with respect to airflow back out through the front face of the server cabinet. If the number of electronic devices to be installed at any given time in a server cabinet is less than the total number of slots provided by the server cabinet, a blanking cover or panel may be inserted in any unused slots. These blanking covers generally provide the equivalent function of an electronic device installed in the slot with respect to preventing an unwanted airflow of heated air through the slot and out the front side of the server cabinet.

However, in instances where one or more unused slots in a server cabinet are left open (e.g., are unoccupied and lack a blanking cover), heated air from within the server cabinet may exit out through the unoccupied, uncovered slot to mix with the cooled air being provided to cool the data center storage space that are installed in the server cabinet and in other server cabinets that may be provided cooling air by the same or other the cold aisles now mixed with the heated air from the unoccupied slot. This mixing of the heated air may cause several issues related to maintaining the proper air temperatures within the data center, including issues related to meeting any customer service level agreement (SLA) terms defining temperature requirements for the data center. To ensure proper cooling and to maintain proper air temperatures within the data center, blanking panels may be used to block or cover the unoccupied slot.

The data center may be a co-location facility in which multiple customers co-locate their network equipment, and data center storage needs of co-location facility customers may change over time. For example, an existing customer may install and later remove some electronic devices from server cabinets. During the electronic device installation process, blanking panels need to be removed to allow the insertion of the electronic device. When electronic devices are later removed, a customer may forget or otherwise fail to reinstall a blanking panel where the electronic device was, leaving an open space. The disclosure describes a fold away blanking panel system includes a first blanking panel and a second blanking panel configured to be affixed to infrastructure in a data center colocation space, such as a cabinet or a frame. The first and second blanking panels are affixed to the infrastructure in a manner that would obscure air access to the infrastructure when the blanking panels are in a closed position, yet enable access to the infrastructure and concurrent installation of electronic devices when the blanking panels are in respective open positions. Because the fold away blanking panels remain installed on the cabinet while the electronic device is installed, when the electronic device is removed, the fold away blanking panels automatically fold back into the closed position.

In some examples, dimensions of data center storage cabinets, racks, and fold away blanking panels are disclosed. Dimensions may include a length, width, height, depth or thickness. Such disclosures are intended to be illustrative and not limiting. Where the term "about" or "approximately" is used in conjunction with any dimension, "about" or "approximately" means within a range of the stated value plus or minus ten percent of the stated value or, alternatively or additionally, the stated value plus or minus a value that enables installation and use of a fold away blanking panel system in industry standard-sized data center cabinets or racks.

FIG. 1 illustrates a plan view of a data center storage space 10 including fold away blanking panel systems in accordance with one or more example techniques of the disclosure. Data center storage space 10, hereinafter referred to as "data center 10" with respect to FIG. 1, comprises an area of a building or other type of industrial or commercial structure that is further enclosed within the building or structure by a set of walls 11. The area enclosed within walls 11 is further divided by interior walls 12, which divide the area enclosed by walls 11 into a plurality of zones, the plurality of zones depicted by areas indicated generally by cabinets 14, 16, 18, and 20. Each of the plurality of zones includes a floor space supporting a plurality of server cabinets.

As illustrated in FIG. 1, data center 10 includes zone 100, zone 200, zone 300 and zone 400 enclosed by walls 11 and separated from each other by interior wall 12, each zone including a different total number of server cabinets. However, this version of data center 10 as shown in FIG. 1 is intended to be illustrative, and not intended to be limiting. Data center 10 in various examples may include more or fewer zones than depicted in FIG. 1. In some examples, the number of zones included in data center 10 may be a single zone, hundreds of zones, or a thousand or more zones. In addition, the number of server cabinets located within a zone of data center 10 is not limited to a particular number, and may be a same number of server cabinets or a different number of server cabinets included in a given zone relative to any other zone of data center 10.

Further, server cabinets 101-106, 201-210, 301-312, and 401-420 are illustrative, and are not limited to any particular type of cabinets, and may comprise any combination of cabinets, and/or mounting cabinets, and/or card cages that are configured to house, power, and/or maintain temperature control for various types of electronic devices mounted into the slots or other physical mechanisms provided in these server cabinets for receiving various types of electrical components. Although the term "server cabinet" or "server cabinets" is used in referring to the cabinets illustrated in FIG. 1 and throughout this disclosure, the cabinets and/or mounting cabinets and/or card cages as provided in a data center, such as data center 10, and that may utilize the devices, systems, and method described in this disclosure and the equivalents thereof, are not limited to cabinets, cabinets, or card cages that house only servers or server components, and may include cabinets and/or mounting cabinets and/or card cages configured to house other types of electrical equipment or electronic devices that may be mounted into the cabinets and/or mounting cabinets and/or card cages provide in a data center.

Because the various electronic devices that may be housed in the server cabinets included in data center 10 often generate heat when operating to perform their various functions, maintaining the level of the temperature within a zone of the data center 10 can be a critical factor in achieving reliability of both the electronic devices themselves and the reliability of overall operations being provided by the electronic devices. Temperatures above a certain level within a zone may have a negative impact on the reliability of the electronic devices, for example causing a shutdown or failure of the electronic device itself, or affecting reliability, for example lowering the speed of operation of the electronic devices in performing their intended functions. Because of these potential issues related to temperature, customers who may own, lease, or otherwise pays for the use of the electrical equipment located within some portion or all of a data center, such as data center 10, may require the operator of the data center to provide and maintain a level of temperature control in the areas where that particular customer's equipment resides within the data center 10.

For example, a customer may own, lease, or otherwise pay for the use of all the electrical equipment included within a given zone of data center 10, for example zone 100 of data center 10. The customer may require that the operator of data center 10 maintain the cooling of the customer's equipment within the customer's zone, such as zone 100, where the customer's electrical equipment resides. The customer may in some instances set a maximum temperature level that must not be exceeded, or dictate a tiered set of ranges of temperatures that must be maintained within the zone or zones where the customer's equipment resides. In various examples, the rate charged to the customer for the operation and maintenance of the customer's equipment within the data center may be dependent on complying with the requirements imposed by the customer regarding temperatures to be properly maintained in the zone or zones of the data center where the customer's equipment resides. The operator of data center 10 is often responsible for the proper maintenance of temperatures within various zones of the data center, and there may be penalties, such as financial fines or withholding of payments to the data center operator imposed by the customers if these temperature requirements are not met and maintained. Further, damage to and failure of equipment caused by overtime may result in additional costs, for example, time cost to diagnose and replace failed equipment, and in the potential lost revenues due to system downtime that may occur when equipment shuts down or fails due to overheating. Regardless of any customer requirements, the probability and overall cost associated with the operation of the data center may be adversely affected by the inefficient cooling of the data center. Thus, the ability to maintain and control the temperatures at the required levels within the zones of the data center 10 may be important with respect to meeting customer requirements and for overall cost efficiency in operating the data center.

In order to control temperatures within data center 10, and in particular with a given zone of data center 10, a cooling system is installed in the data center that allows in some instances cooling of the data center 10 in general, and in various example individual control of the cooling within one or more of the zones within the data center. Cooling is often provided by a flow of cooled air delivered to a cold aisle next to the server cabinets that are to be cooled. The flow of cooled air may be provided to the cold aisle through perforated floor panels within the cold air aisle, or for example by a system of overhead cold-air ducts and vents that may be controlled to provide cold air to the cold aisle from a cold air source. In addition, server cabinets within the data center may be configured so that heat-generating electronic devices located within the server cabinets take in the cooling air from the adjacent cold aisle to cool the electronic devices, and expel the heated air generated by the cooling of the electronic devices out a backside of the server cabinets. The backside of the server cabinets may be further enclosed within a zone of the data center to form one or more hot aisles. The hot aisles may be enclosed to segregate the hot aisle from the remaining portions of the zone to prevent the heated air from reaching the cold aisle and other portions of the zone. Further, the hot aisles may be ventilated to remove the hot air by creating an airflow that exits the hot aisle, and is therefore removed for the zone of the data center 10 coupled to the hot aisle. The removed hot air flowing out of the hot aisle may simply be expelled from the data center 10, or may be further processed, for example by cooling the air, to be reused by recirculating the now cooled air to the cold aisle once the of the hot air had been cooled to a temperature level required for providing cooling air to the server cabinets along the cold aisles.

By way of example, zone 100 of data center 10 includes a cold aisle generally indicated by arrow 22A. Cold aisle 22A extends to a front side of server cabinets 101, 102, and 103, generally indicated by arrow 108, and to a front side of server cabinets 104, 105, and 108, generally indicated by arrow 109. Cooling air provided to cold aisle 22A is available for intake and cooling of electronic devices mounted in each of server cabinets 101-106. In addition, zone 100 includes a pair of hot aisles, 23A, 23B. Hot aisle 23A extends along the backside (opposite side of front side 108) of server cabinets 101, 102, and 103, and is further closed off from the remaining portions of zone 100 by access door 24A. Hot aisle 23A is configured to receive flows of hot air, generally indicated by arrow 25, provided as heated air generated by the operation of the electrical equipment mounted in server cabinets 101, 102, and 103. Hot aisle 23A further comprises additional walls and/or ductwork (not specifically shown in FIG. 1) that prevent heated air received from the backsides of cabinets 101, 102, and 103 from reaching the other portions of zone 100, including cold aisle 22A. In various examples, hot aisle 23A further comprises additional structures that allow for the removal of the heated air received in hot aisle 23A, to be expelled or cooled and recirculated within data center 10 as described above.

In a similar manner, a second hot aisle 23B is constructed along a backside (the side opposite front side 109) of server cabinets 104, 105, and 106. Hot aisle 23B is isolated from the remainder of zone 100, for example by access door 24B, and additional structure or ductwork (not specify shown in FIG. 1). Hot aisle 23B is further configured to receive heated air generated by the operation of electronic devices mounted in server cabinets 104, 105, 106, and to prevent the heated air from reaching the remaining portions of zone 100, including cold aisle 22A. In various examples, hot aisle 23A further includes additional structures that allow for the removal of the heated air received in hot aisle 23B, to be expelled or cooled and recirculated within data center 10 as described above.

Use of the cold aisle 22A to provide cooling air to the electronic devices mounted in server cabinets 101-106, and use of the hot aisles 23A, 23B to isolate and remove hot air generated by the devices operating in server cabinets 101-103 and 104-106, respectively, helps allow for efficient maintenance of temperature within zone 100 of data center 10. This can help the data center provider to adhere to customer service level agreement (SLA) terms defining temperature requirements. In addition, because zone 100 is further isolated from other zones within data center 10 by internal walls 12, a specific temperature requirement dictated for example by a customer who owns, leases, or pays for the use of the electrical equipment located within zone 100 can be maintained, monitored, and regulated separately and without necessarily being associated with the temperature requirement of any other zone or zones within the data center.

In various examples the electronic devices mounted in the server cabinets are configured to receive the cold air for the cold aisle at a front side 109 of the server cabinets, cool the electronic equipment, and expel the hot air toward the backside of the server cabinets. In many instances, a server cabinet, such as server cabinet 103, will include one or more slots that are not occupied by an electronic device or by a blanking cover for each of the one or more slots. These "open" or "unoccupied" slots may provide a path for heated air, generally indicated by arrow 26, to exit a server cabinet, such as server cabinet 103, and mix with, and thus contaminate the cooled air provide at cold aisle 22A with heated air. This mixing and contamination of the cooled air can cause an increased need to provide additional and/or colder air at cold aisle 22A to maintain the required temperate level at any given time within zone 100. This mixing/contamination of the cooling air provided at cold aisle 22A may result in a decrease in the efficiency of the cooling of zone 100, and may also add to the overall cost of operating the data center 10. In some examples of the mixing of the cooling air provided at cold aisle 22A with the heated air exiting one or more unoccupied slots of the server cabinets may occur to an extent that prevents the regulation of the temperature of zone 100 from being maintained at the required level, and thus may cause equipment overheating and/or equipment failure of the electrical equipment housed in the server cabinets, and/or financial penalties levied by the customer as a result of not maintaining the required temperatures and/or as a result of a customer's equipment failures or system downtimes resulting from the overtemperature conditions in the zone or zones of the data center where the customer's equipment is being housed and operated. In various examples, fold away blanking panel systems affixed to each slot of the server cabinets 101-106 may be used to obscure airflow access to the slot in a closed position and enable access to the slot and concurrent installation of electronic devices when the fold away blanking panels of the systems are in respective open positions. In a manner similar to that described above with respect to zone 100, the additional zones (200, 300, and 400) of data center 10 may be arranged to include cold aisles that provide cooling air to a front side of the server cabinets within the zone, and hot aisles that receive and remove hot air generated by the operation of the electronic devices mounted in the server cabinets.

The fold away blanking panel system, when installed in the front face of a slot of a server cabinet, is configured to block substantially any flow of air from exiting out from the front face of the server cabinet through the slot covered by the fold away blanking panel systems. As further described below (e.g., with respect to FIG. 6), each of the server cabinets included in a zone, such as zone 100 in FIG. 1, comprise a set of fold away blanking panel systems configured to obscure air access to the cabinet in a closed position, yet enable access to the cabinet and concurrent installation of electronic devices when the fold away blanking panels are in respective open positions using various techniques described in this disclosure. The blanking panels of the system may fold inwards to an interior of the cabinet to allow electronic devices to be inserted in a slot of the cabinet.

Figure 2:
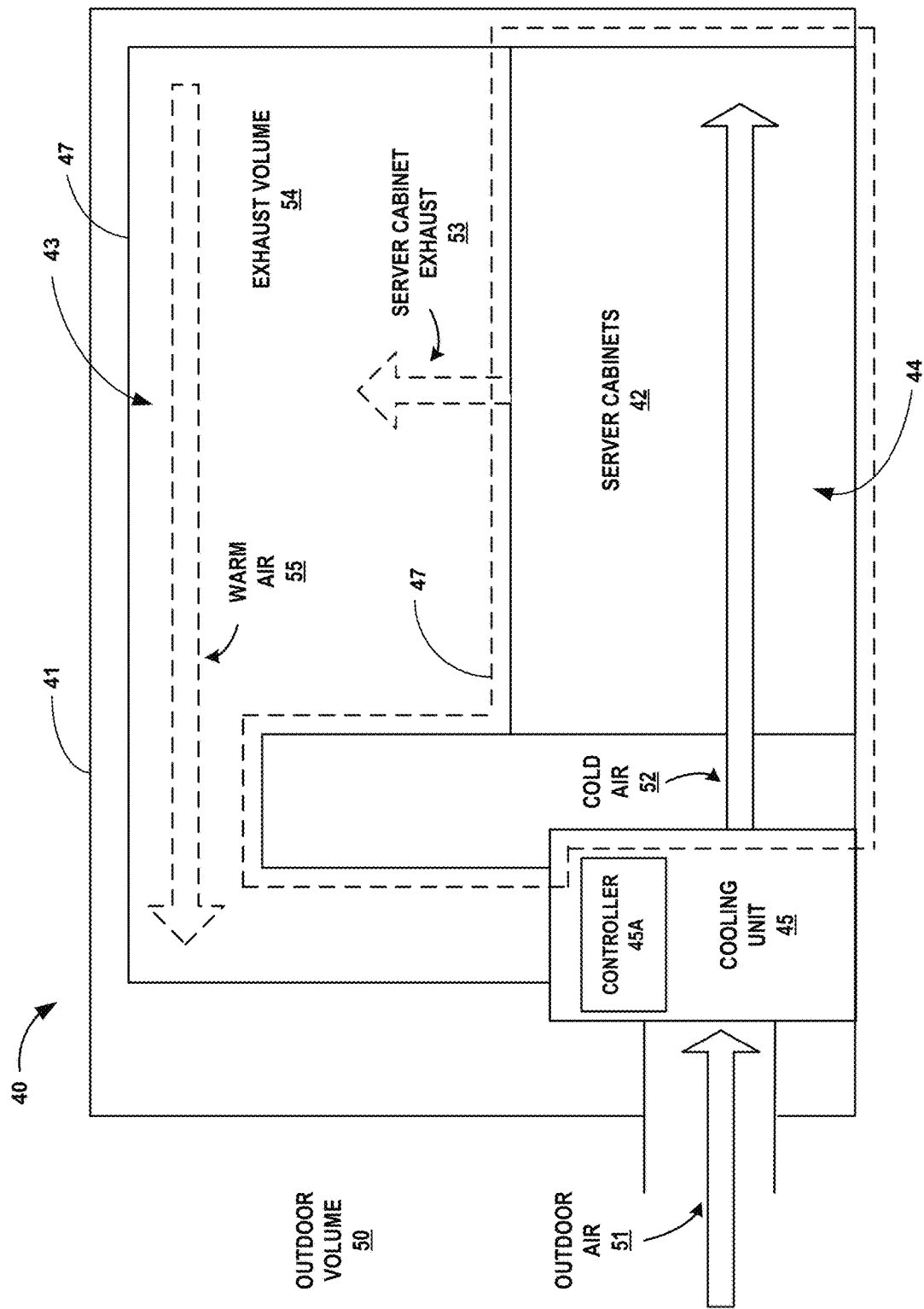
FIG. 2 illustrates a side cross-sectional view of a portion of the data center storage space of FIG. 1, in accordance with one or more example techniques of the disclosure.

FIG. 2 is a block diagram 40 that illustrates a more detailed view of a storage volume 41 of the data center 10 of FIG. 1, in accordance with one or more techniques of the disclosure. Storage volume 41 of data center 10 includes a plurality of server cabinets 42 located within storage volume 41. Server cabinets 42 as illustrated in FIG. 2 may be illustrative of any of number of the server cabinets illustrated and described with respect to FIG. 1. As illustrated in FIG. 2, the storage volume 41 includes one or more cold aisles 44 enclosing a portion of the server cabinets 42, including a front side of the server cabinets 42. Storage volume 41 further includes one or more hot aisles 43 that are physically separated, for example by structure 47 (e.g., walls, access doors and/or ductwork), with respect to air flows from the cold aisles 44, the hot aisles configured to enclose a backside of server cabinets 42.

A cooling unit 45 is physically coupled to storage volume 41 to receive air flows from and to provide air flows to storage volume 41. Cooling unit 45 may include an outdoor air intake 51 coupling the cooling unit 45 to an outdoor volume 50 of air, a warm air intake 55 (also referred to herein as "a return air intake") coupling the cooling unit 45 to an exhaust volume 54 of air provided by the backside of server cabinets 42, and a cold air output 52 (also referred to herein as "a supply air output") coupling the cooling unit 45 with the cold aisles 44 of the storage volume 41. Cooling unit 45 may include one or more air dampers (not specifically shown in FIG. 2), such as an outdoor air damper that controls the amount of airflow received at outdoor air intake 51 from the outdoor volume 50, and a return damper that controls the amount of airflow received from warm air intake 55 from exhaust volume 54.

Cooling unit 45 in various examples includes a controller 45A. Controlling the operations of cooling unit 45 may include, for example, controlling the states of outdoor air damper and return air damper to adjust the respective proportions of the incoming outdoor air received at outdoor air intake 51 and return air received at warm air intake 55 by adjusting positions of the respective outdoor air damper and return air damper. In some examples, the outdoor air damper is completely closed when cooling unit 45 is in mechanical mode, and the outdoor damper may be least partially open when cooling unit 45 is in economizer mode.

When operating to control the temperature of storage volume 41, cooling unit 45 receives return air at warm air intake 55 that may be heated by operation of electronic devices mounted in the server cabinets 42, and, based on control input provided by controller 45A, generates the flow of supply air provided at cold air output 52 being returned to the storage volume 41. Returning the flow of supply air to storage volume 41 may include mixing the return air with outdoor air provided at outdoor air intake 51, cooling the air to be provided as the supply air, and/or adjusting the level of humidity in the air to be returned as the supply air. In addition, the fan array of cooling unit 45 may adjust one or more fan speeds to increase or decrease or the flow rate of the supply air being returned to the storage volume 41.

More or less cooling may be required of the cooling unit 45 depending on the current operating state of storage volume 41. For example, depending on the temperature of the air entering the cooling unit 45, including return air received at warm air intake 55 and/or outdoor air received at outdoor air intake 51, more or less cooling may be required. In addition, if one or more of the slots of server cabinets 42 are not occupied, as described above, heated air that would normally be received as server exhaust air 53 and provided as return air may instead exit the server cabinet 42 through the one or more unoccupied slots, and thus mix with and contaminate the supply air being provided to the front side of the server cabinets 42. This unintended mixing of the supply air may reduce the efficiency of the overall cooling of storage volume 41. For example, the heated air exiting the one or more unoccupied slots in the server cabinets 42 is not available as part of the exhaust volume that may be returned to cooling unit 45, and may instead heat the supply air provided to the front side of the server cabinets. This heated air may then reenter the server cabinets and flow over the electronic devices mounted in the server cabinets, but may fail to provide the cooling expected based on the temperature of the supply air original provided to the server cabinets.

The recirculation of this warmed air to the server cabinets may reduce the overall efficiency of the cooling of the storage volume 41, resulting in increased costs to maintain the required temperatures with storage volume 41. If the proper temperate cannot be maintained, even if the over-temperature conditions only exist for a short period of time, the conditions may result in cost penalties levied by the customer as described above. In addition, the recirculation of this heated air may cause one or more of the electronic devices mounted in server cabinets 42 to overheat and/or fail, resulting in loss of that device and the possibility of an overall shutdown of the service being provided at least in part by that device, which may again result in a cost penalty levied against the operator of the storage volume or against the operator of the data center, or actual lost revenue for the customer who owns, leases, or other uses the serves provided by the failed electronic devices residing in the data center due to the shutdown of their system.

The fold away blanking panel system described in this disclosure includes at least a first blanking panel and a second blanking panel configured to be affixed to a cabinet of a data center. The first and second blanking panels are affixed to the cabinet in a manner that would obscure air access to a slot of the cabinet in a closed position, yet enable access to the slot of the cabinet and concurrent installation of electronic devices when the blanking panels are in respective open positions. The first and second blanking panels of the system may fold inwards to an interior of the cabinet to allow electronic devices to be inserted in the slot of the cabinet, while the pair of blanking panels remains installed. The fold away blanking panel system allows persons, such as customers and persons operating a data center, to conveniently remove or install an electronic device to the slot of the cabinet without removing the fold away blanking panel system from the cabinet, even when electronic devices are installed in the slot of the cabinet.

Figure 3A:
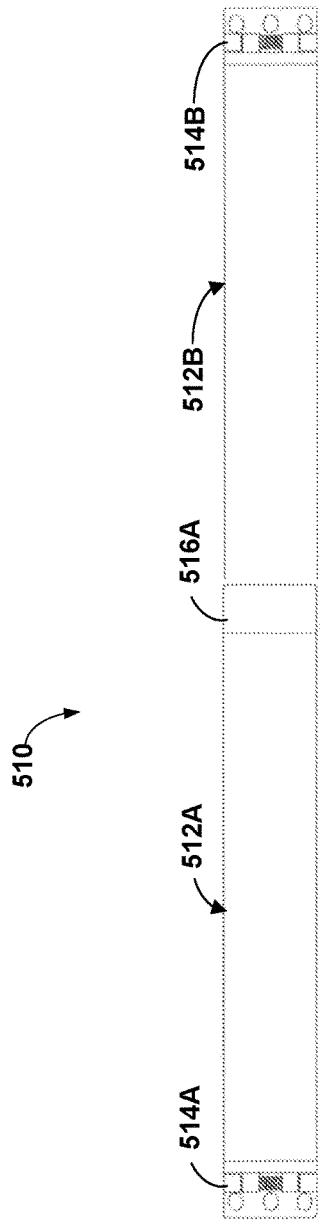
FIG. 3A is a front perspective view of an example fold away blanking panel system, in accordance with one or more techniques of the disclosure.

FIG. 3A is a front perspective view of an example fold away blanking panel system 510, in accordance with one or more techniques of the disclosure.

The fold away blanking panel system 510 may include a blanking panel 512A and a blanking panel 512B (collectively "blanking panels 512") configured to be affixed a cabinet or a frame to block a section of an equipment area within the cabinet or the frame.

Each blanking panel of the blanking panels 512 includes a spring-loaded hinge and a connecting mechanism. As shown in FIG. 3A, the blanking panel 512A includes a spring-loaded hinge 514A and a connecting mechanism 516A, while the blanking panel 512B includes a spring-loaded hinge 514B and a connecting mechanism 516B.

The spring-loaded hinge 514A and the spring-loaded hinge 514B (collectively "spring-loaded hinges 514") may be located proximal to the ends of the blanking panels 512. The spring-loaded hinges 514 may interconnect the blanking panels 512 to a cabinet or a frame. For example, the blanking panels 512 may be affixed to a cabinet by attaching the spring-loaded hinges 514 to the cabinet via fastening means, such as screws, bolts, nails, staples, welding, adhesives, or the like.

The spring-loaded hinges 514 are configured to rotate between a non-deployed position and a deployed position. For example, the spring-loaded hinges 514 may rotate from the non-deployed position to the deployed position in response to a force applied to the blanking panels 512. The blanking panels 512 may rotate inwardly in response to the spring-loaded hinges 514 rotating from the non-deployed position to the deployed position.

When the spring-loaded hinges 514 are in the deployed position, the blanking panels 512 are configured to be out of contact with each other and into respective open positions such that equipment, such as an electronic device, may be inserted into a storage space between the blanking panel 512A and the blanking panel 512B. In some examples, when the spring-loaded hinges 514 are in the deployed position and the blanking panels 512 are in the respective open positions, the blanking panel 512A is at about a 90-degree angle relative to when the blanking panel 512A was in a closed position and the blanking panel 512B is at about a 90-degree angle relative to when the blanking panel 512B was in the closed position. About a 90-degree angle, as used herein, means within a range of 90 plus or minus 10 degrees.

Once an electronic device is inserted into the storage space between the blanking panel 512A and the blanking panel 512B, the electronic device may be in direct contact with the blanking panels 512 to hold the blanking panels 512 in respective open positions.

The electronic device may also be removed from the storage space between the blanking panel 512A and the blanking panel 512B. When the electronic device is removed from the storage space between the blanking panel 512A and the blanking panel 512B, the spring-loaded hinges 514 rotate from the deployed position to the non-deployed position and cause the blanking panels 512 to automatically revert from the open positions to the closed position.

When the spring-loaded hinges 514 are in the non-deployed position, the connecting mechanism 516A and the connecting mechanism 516B (collectively "connecting mechanisms 516") are configured to connect the blanking panel 512A with the blanking panel 512B in the closed position to block airflow.

Figure 3B:
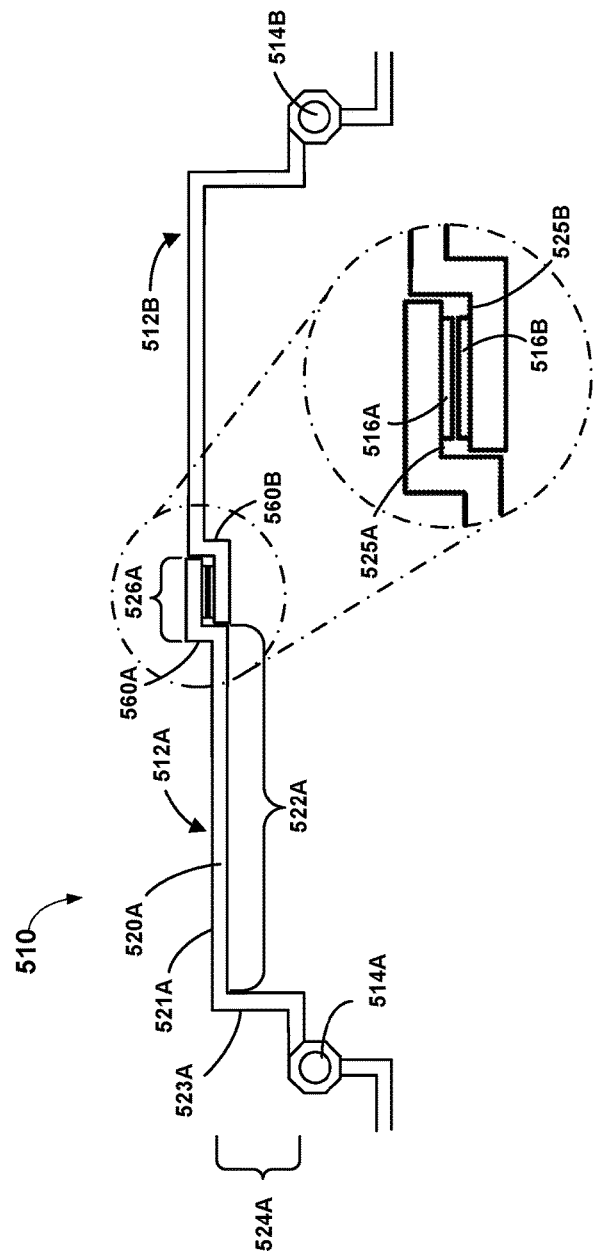
FIG. 3B is a top perspective view of the fold away blanking panel system shown in FIG. 3A, in accordance with one or more techniques of the disclosure.

FIG. 3B is a top perspective view of the front side of the fold away blanking panel system 510, in accordance with one or more techniques of the disclosure. As shown in FIG. 3B, the connecting mechanism 516A is disposed at an inner side of the blanking panel 512A and the connecting mechanism 516B is disposed at an outer side of the blanking panel 512B. The inner side of a fold away blanking panel is the side of the fold away blanking panel that faces the interior of the cabinet when the fold away blanking panel is in the open position. Similarly, the outer side of a foldaway blanking panel is the side of the fold away blanking panel that faces the exterior of the cabinet when the fold away blanking panel is in the open position. FIG. 3B illustrates an example fold away blanking panel system 510 in the closed position. FIG. 5B illustrates an example fold away blanking panel system 510 in the open position.

The blanking panel 512A includes an angled stepped body configured to engage with the blanking panel 512B when the blanking panels are in the closed position. As shown in FIG. 3B, the blanking panel 512A includes a panel body 520A, which includes a first portion 522A with a first surface 522A, a second portion 524A with a second surface 523A disposed at an end of panel body 520A, and a third portion 526A with a third surface 525A disposed at another end of panel body 520A. First portion 522A and first surface 521A may be disposed on panel body 520A between second portion 524A and third portion 526A. In some examples, the angle defined between first surface 521A and the second surface 523A may be approximately 90 degrees. In other examples, the angle defined between a first surface 521A and the second surface 523A may any suitable degrees, such as approximately 120 degrees. Blanking panel 512B may also include a panel body with similarly defined portions and surfaces, e.g., surface 525B. As shown in FIG. 3B, the blanking panel 512B has a structure in which the left side and the right side are inverted compared with the blanking panel 512A, allowing the connecting mechanisms 516A and 516B to connect the first blanking panel with the second blanking panel in a closed position. The angles of the respective steps 560A and 560B of blanking panels 512A, 512B may be about 90-degrees. The angles of the respective steps 560A and 560B of blanking panels 512A, 512B may be substantially offset from 90-degrees and different from one another but may be supplementary.

The blanking panels 512 can be secured together in a closed position using connecting mechanisms 516. In some examples, the connecting mechanisms 516 may include a magnetic region. For example, a magnet may be mounted to an end of a blanking panel, such as blanking panel 512B. The magnet may be, for example, glued or otherwise affixed to an end of blanking panel 512B. For example, when an electronic device is removed from the storage space between the blanking panel 512A and the blanking panel 512B, the spring-loaded hinges 514 rotate from the deployed position to the non-deployed position such that the connecting mechanism 516A of the blanking panel 512A is in direct contact with the connecting mechanism 516A of the blanking panel 512A. When the connecting mechanism 516A of the blanking panel 512A is in direct contact with the connecting mechanism 516B, the magnet mounted on the blanking panel 512B connects the blanking panel 512A with the blanking panel 512B in the closed position. In some examples, the connecting mechanisms 516 may comprise any suitable connecting mechanisms according to particular needs. For example, the connecting mechanisms 516 may further comprise a locking mechanism. The connecting mechanisms 516 may help provide an improved air seal for the blanking panels.

The panel body 520A is formed of one or more materials. The one or more materials include one or more materials selected from a metal, a plastic, or combinations thereof. For example, the panel body 520A may be made of a metal, such as stainless steel. In such cases, the connecting mechanism 516A of the blanking panel 512A may be a magnet configured to be in direct contact with the blanking panel 512B to secure blanking panels 512A and 512B together in the closed position. In some examples, the panel body 520A may be made of plastic or other durable polymer. Additional types of plastic from which panel body 520A, or other blanking panels described herein, may be formed are listed below. In such cases, an additional metal piece, such as connecting mechanism 516B, may be affixed to blanking panel 512B, for the magnet of the blanking panel 512A, such as the connection mechanism 516A, to connect to and to provide an improved air seal for the blanking panels.

Figure 4A:
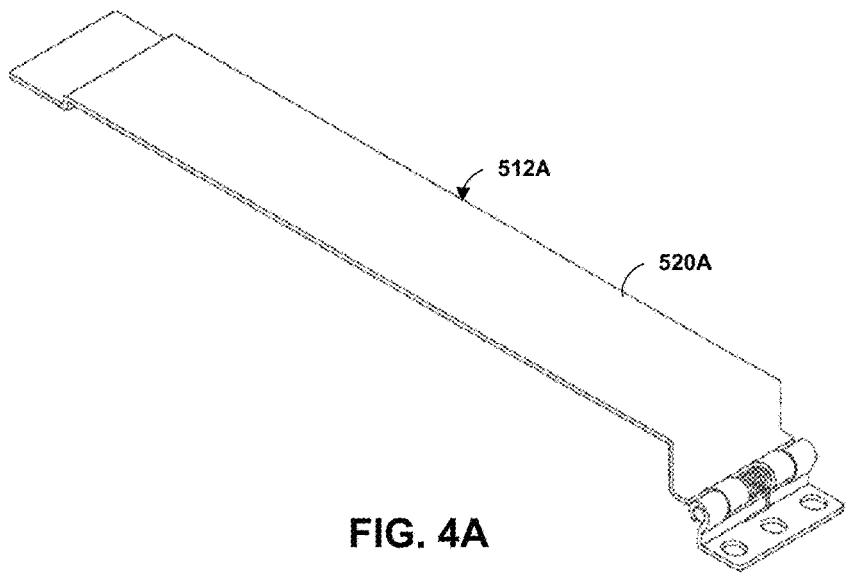
FIG. 4A is a perspective view of a blanking panel of the fold away blanking panel system of FIG. 3A, in accordance with one or more techniques of the disclosure.

FIG. 4A is a perspective view of the blanking panel 512A of the fold away blanking panel system 510, in accordance with one or more techniques of the disclosure. As shown in FIG. 4A, the blanking panel 512A has a panel body 520A.

The panel body 520A may be any suitable dimension according to particular needs. In some examples, the height of the panel body 520A may be selected based on a height of a slot of a cabinet, such as to be substantially the same height as the slot of the cabinet. For example, the panel body 520A may have a height of about 43.15 millimeters (mm). In some examples, the width of the panel body 520A may be selected based on a width of the cabinet, such as to be slightly longer than half of the width of the cabinet, or slightly longer than half of the width of the front opening of the cabinet. Such width facilitates overlap of the cabinet frame and the panel body 520A to reduce or eliminate any gap and any airflow that would otherwise result. A cabinet may alternatively be referred to as a rack. A rack unit (U or RU) is a unit of measure defined as 1.75 in (44.45 mm), and the cabinet frame and equipment may be expressed as multiples of rack units (e.g., 1RU, 2RU, etc.). Panel body 520A may have a height that is slightly less than a multiple of RUs. This may allow an installed panel body 520A to swing freely when adjacent to other cabinet-mounted components, including other instances of installed panel body 520A. For example, a height of panel body 520A may be 1RU-n, 2RU-n, and so on, where n is a small value (e.g., 0.05 inches) to ensure a small gap between installed blanking panels and other equipment installed to the cabinet (including other blanking panels).

For example, the panel body 520A may have a width of about 230.1875 mm. In some examples, the panel body 520A may be approximately 43.15 mm (1.7 inches) high by about 230.1875 mm (9.0625 inches) wide.

The panel body 520A can have a relatively thin thickness. For example, the panel body 520A may have a thickness of about 31.06 mm. Using a relatively thin panel body may result in material saving and may shorten cooling time that, in turn, provides cost savings and may help optimize cycle time for manufacturing the panels.

Reference to height, width, and depth dimensions of blanking panels described herein correspond to the height, width, and depth dimension of a cabinet. For example, a height of a blanking panel is along a dimension of the blanking panel that is substantially parallel to a height dimension of the cabinet when the blanking panel is affixed to the cabinet in a functional, intended position.

Figure 4B:
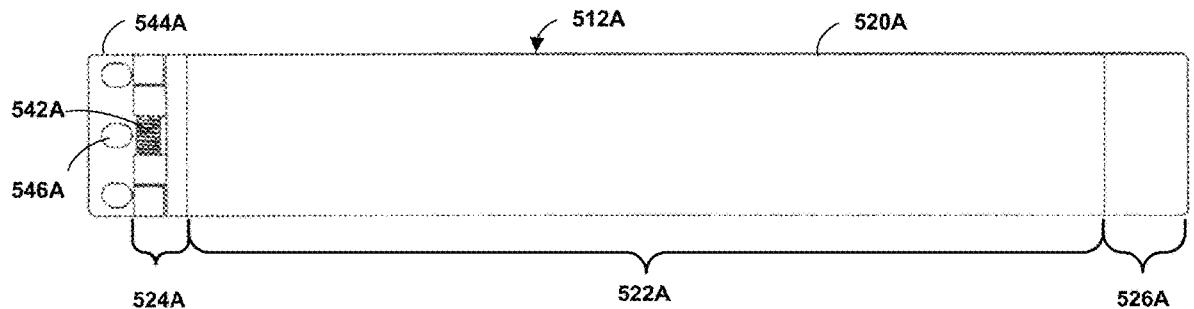
FIGS. 4B-4D are a top view, a bottom view, and a side view of the blanking panel shown in FIG. 4A.
Figure 4C:
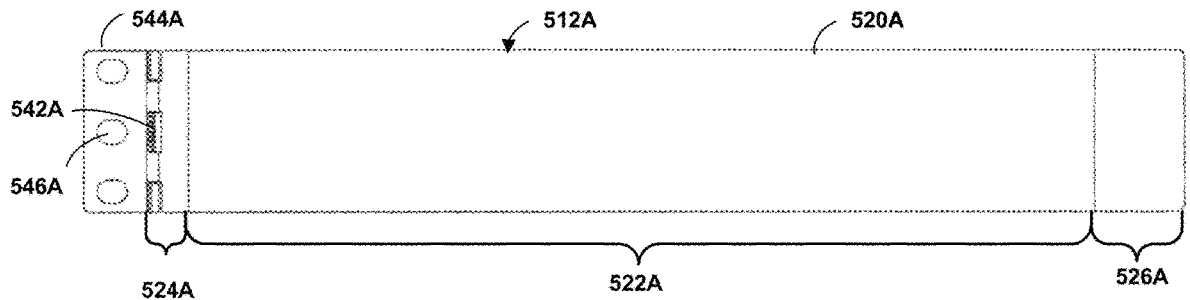
Figure 4D:
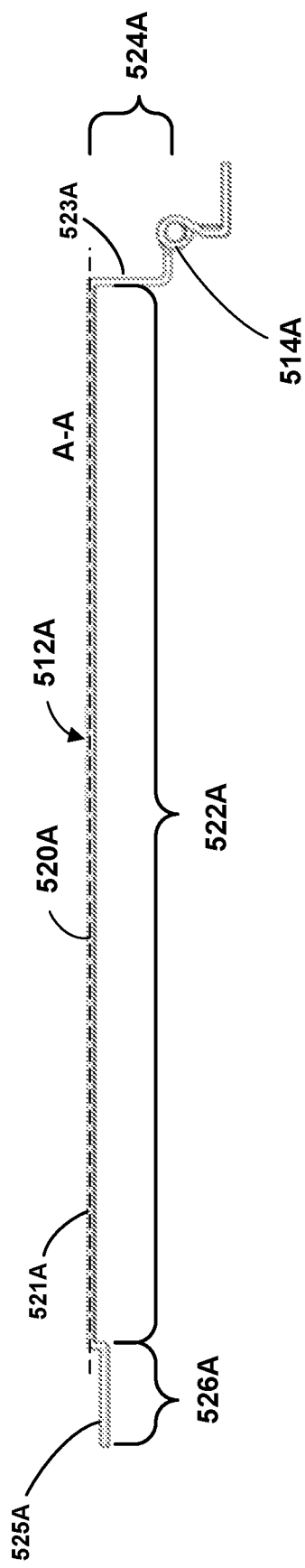

FIGS. 4B-4D are top view, bottom view, and side view of the blanking panel shown in FIG. 4A. As shown in FIGS. 4B-4D, the panel body 520A includes a first portion 522A with a first surface 521A, a second portion 524A with a second surface 523A disposed at an end of panel body 520A, and a third portion 526A with a third surface 525A disposed at another end of panel body 520A. First portion 522A and first surface 521A may be disposed on panel body 520A between second portion 524A and third portion 526A.

In some examples, the second surface 524A is disposed at an end of the first surface 522A and is perpendicular with respect to a longitudinal axis A-A of the first surface 522A. In some examples, the third surface 526A is parallel with respect to the longitudinal axis A-A of the first surface 522A.

Each of the first portion 522A, the second portion 524A, and the third portion 526A may have a suitable length. For example, the first portion 522A may have a length of about 236.5 mm, the second portion 524A may have a length of about 31.06 mm, the third portion may have a length of about 15.63 mm, although other lengths may be used. The lengths of first portion 522A and third portion 526A, when blanking panel 512A is installed, correspond to the width dimension of the cabinet and the width of blanking panel 512A.

Figure 4F:
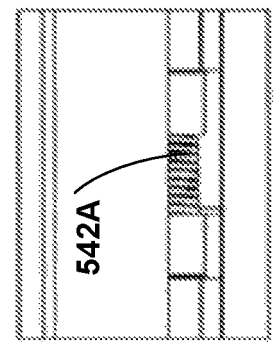
FIGS. 4E-4F are a top view and a bottom view of a spring-loaded hinge of the blanking panel of FIG. 3A, in accordance with one or more techniques of the disclosure.
Figure 4E:
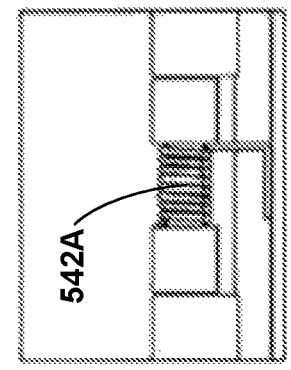

FIGS. 4E-4F are a top view and a bottom view of a spring-loaded hinge 514A of the blanking panel 512A of FIGS. 4A-4D, in accordance with one or more techniques of the disclosure.

The spring-loaded hinge 514A includes a spring 542A that is configured to provide adequate tension to automatically revert blanking panel 512A from the open position to the closed position when pressure is no longer being applied to keep blanking panel 512A in the open position (such as by the presence of an electronic device installed in the cabinet).

The spring 542A may be made of steel or stainless steel and the torsional strength of the spring 542A may be correlated to the size and weight of the blanking panel 512A.

As shown in FIGS. 4B-4C, the spring-loaded hinge 514A includes a mounting bracket 544A that can be secured to an inner wall of a cabinet by a fastener passing through bracket hole 546A and into the inner wall of the cabinet. Various fastening means, such as screws, bolts, nails, staples, welding, or adhesives, may be used to secure the spring-loaded hinge 514A to the inner wall of the cabinet. For example, the spring-loaded hinge 514A may be fastened the cabinet by ¼ inch screws to affix the blanking panel to the cabinet. In some examples, the mounting bracket 544A may be formed of one or more materials. The one or more materials include one or more materials selected from a metal, a plastic, or combinations thereof. For example, the mounting bracket 544A can be formed from stainless steel or durable polymer.

In some examples, the spring-loaded hinge 514A is integral with the panel body 520A of blanking panel 512A. In other examples, the spring-loaded hinge 514A is affixed to the panel body 520A of blanking panel 512A by various fastening means, such as screws, bolts, nails, staples, welding, adhesives, or the like.

Figure 5A:
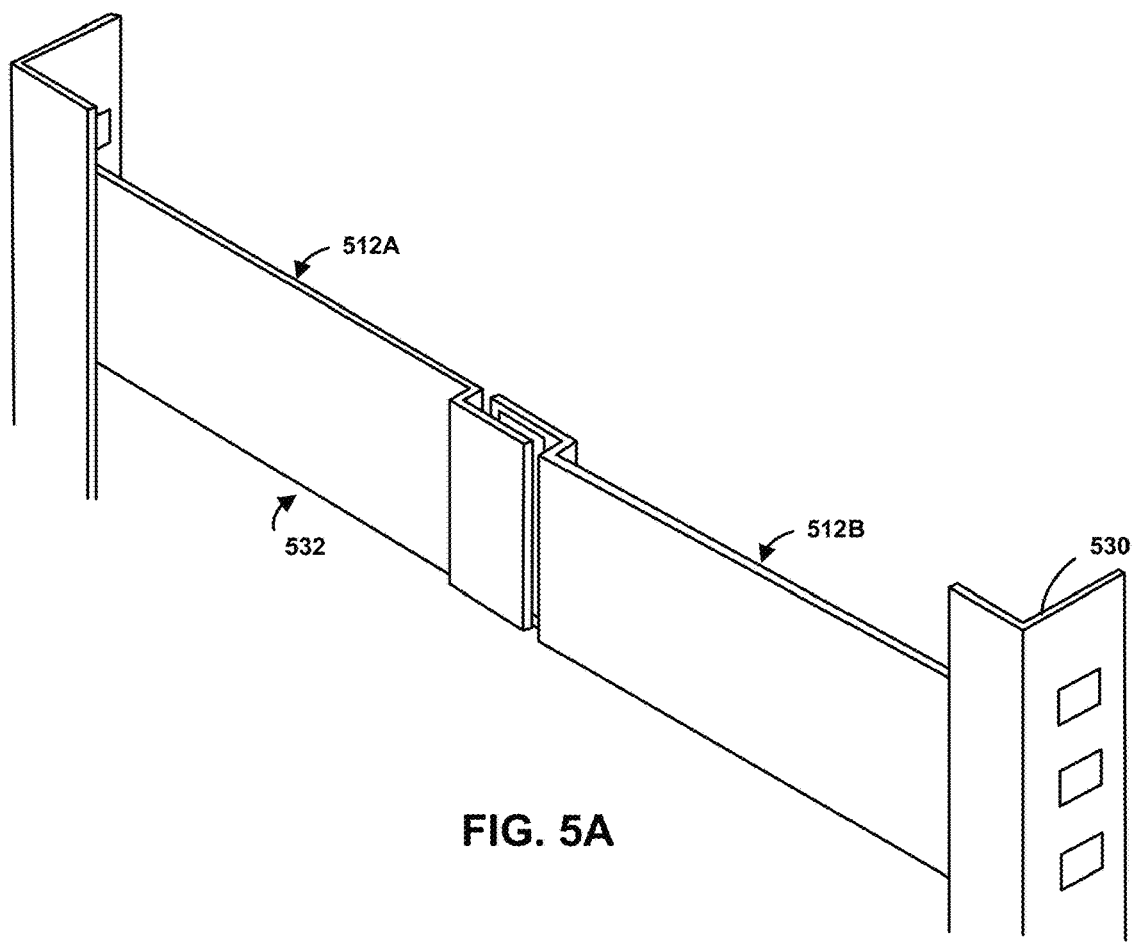
FIG. 5A is a perspective view of the fold away blanking panel system of FIG. 3A attached to an example cabinet, with blanking panels of the fold away blanking panel system in a closed position, in accordance with one or more techniques of the disclosure.
Figure 5B:
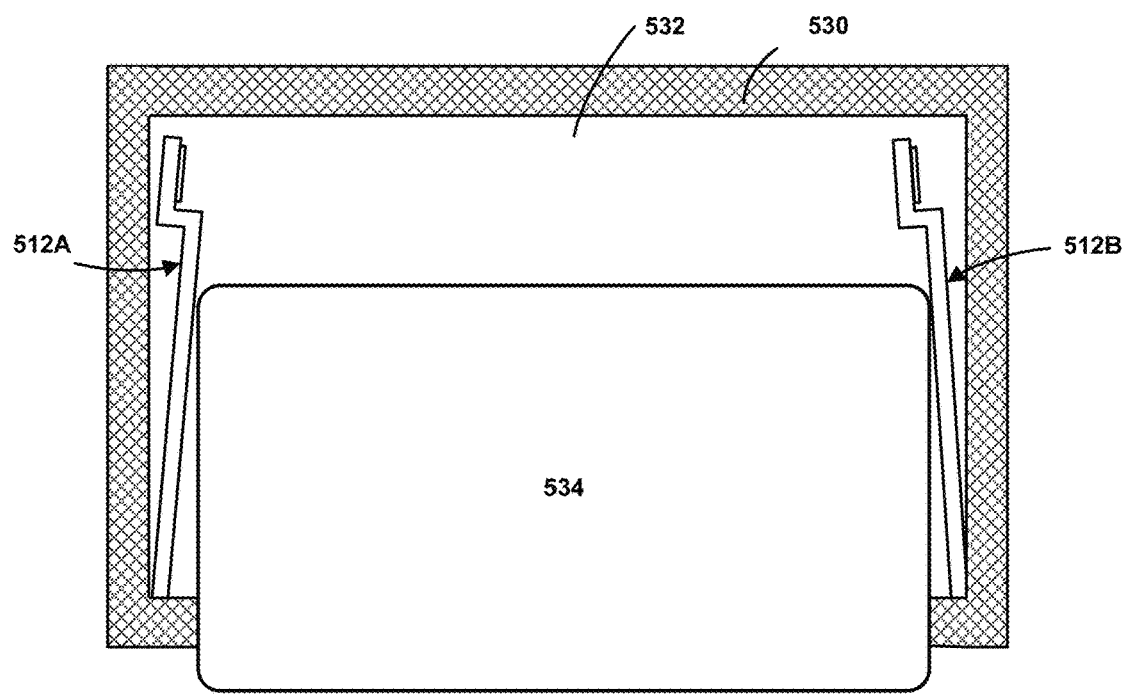
FIG. 5B is a perspective view of the fold away blanking panel system of FIG. 3A, with blanking panels of the fold away blanking panel system in open positions, in accordance with one or more techniques of the disclosure.

FIG. 5A is a perspective view of an example fold away blanking panel system 510 attached to a frame 530, with the blanking panels 512 of the fold away blanking panel system 510 in a closed position, in accordance with one or more techniques of the disclosure. The portion of frame 530 to which the fold away blanking panels attach may also be referred to as an equipment rail.

The frame 530 of the cabinet may be part of an equipment cabinet for mounting one or more types of equipment, such as servers, switches, routers, patch panels, uninterruptible power supplies (UPSs), monitors, and other equipment.

In some examples, the frame 530 may be approximately 73.5 inches high by 24 inches wide. The frame 530 may have a depth of 36 inches. Frame 530 having other width and/or depth may also be used. In some examples, the frame 530 may be installed on a floor by fastening means such as steel bolts, nuts, screws, plates, and washers to attach the frame 530 to the floor. In some examples, the frame 530 may be installed using expansion anchors in concrete having the capability to sustain, without failure, load imposed within factors of safety indicated. The anchors may include drop-in anchors, and may be zinc-plated carbon steel, for example.

As shown in FIG. 5A, a slot 532 of the frame 530 is blocked when the blanking panels 512 are in the closed position and the spring-loaded hinges 514 are in the non-deployed position (not shown). This prevents airflow in the spot where the blanking panels are present.

FIG. 5B is a perspective view of the fold away blanking panel system 510 attached to the frame 530, with the blanking panels 512 in respective open positions, in accordance with one or more techniques of the disclosure.

As shown in FIG. 5B, the slot 532 of the frame 530 is accessible when a server 534 is inserted into the storage space between the blanking panel 512A and the blanking panel 512B. The server 534 is in direct contact with the blanking panels 512 to hold the blanking panels 512 in respective open positions and to hold the spring-loaded hinges 514 in deployed position (not shown). An angle at which the blanking panels 512 are held open by the server 534 is dependent on a width of the server 534. For example, a wider server will hold the blanking panels 512 in a wider open position than a narrower server 534.

The blanking panels are configured such that they may be installed by coupling to the equipment rail of a cabinet, where the first and second connecting mechanisms are configured to connect the first blanking panel with the second blanking panel in a closed position when the first and second spring-loaded hinges are in a non-deployed position. The server can be inserted between the first blanking panel and the second blanking panel, where each of the first and second spring-loaded hinges of the blanking panels is configured to rotate from the non-deployed position to a deployed position in response to insertion of the server. The first blanking panel and the second blanking panel are out of contact with each other and in respective open positions when the first and second spring-loaded hinges are in the deployed position. After inserting the server into the storage space of the cabinet, the server is coupled to the cabinet while the first blanking panel and the second blanking panel remain affixed to the cabinet and in the respective open positions. The server can later be removed from the storage space between be first blanking panel and the second blanking panel, and each of the first and second spring-loaded hinges is configured to rotate from the deployed position back to the non-deployed position in response to the removal of the server.

Servers housed by the frame 530 may be systems that respond to requests across a computer network to provide, or help to provide, a network or data service. Each of the servers may include one or more processors that execute software that is capable of accepting requests from clients. Requests from clients may be to share data, information, or hardware and software resources. The servers may include one or more of a database server, file server, storage server, mail server, print server, web server, gaming server, application server, communication server, compute server, media server, or any other suitable type of server that may be employed by a data center provider or tenant of the data center provider, according to particular needs. The servers may be specialized or general-purpose devices. The servers may represent x86 or other real or general-purpose servers configured to apply and/or offer services to customers. The servers may also include special-purpose appliances or controllers for providing interconnection services between customers of a co-location facility provided by the data center or for providing any other suitable services according to particular needs.

Figure 6:
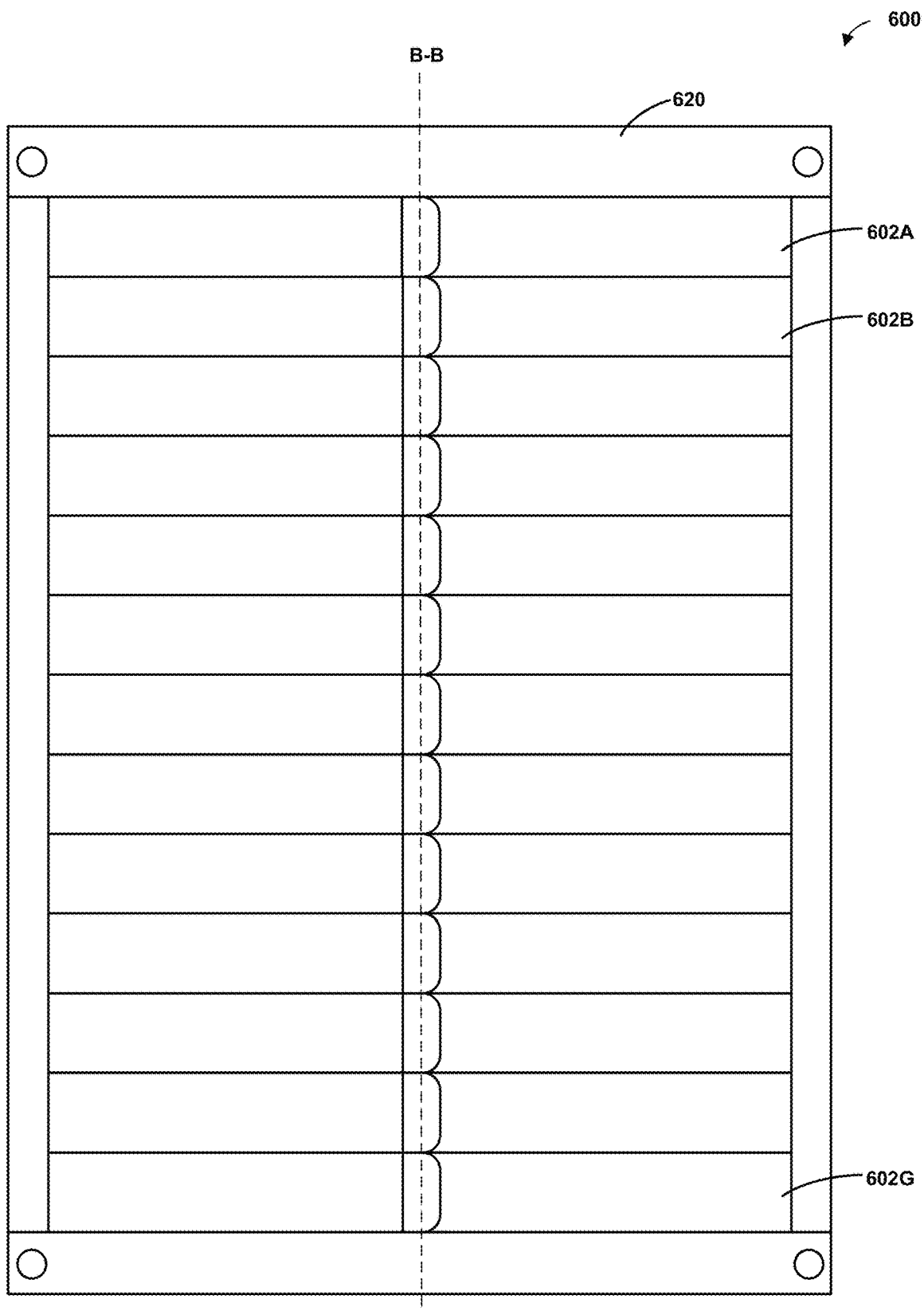
FIG. 6 is a perspective view of another example fold away blanking panel system, in accordance with one or more techniques of the disclosure.

FIG. 6 is a perspective view of another example fold away blanking panel system 600, in accordance with one or more techniques of the disclosure. In some examples, instead of a single pair of blanking panels, a plurality pairs of blanking panels, such as a plurality pairs of blanking panels 602A-602G ("blanking panels 602"), may be included in the fold away blanking panel system 600.

Each pair of blanking panels 602 may be affixed to a cabinet, such as cabinet 620. For example, each pair of the plurality pairs of blanking panels 602 may be arranged along a longitudinal axis B-B of the cabinet 620. The plurality pairs of blanking panels 602 are affixed to the cabinet 620 in a manner that would obscure air access to the cabinet 620 in a closed position, yet enable access to the cabinet 620 and concurrent installation of electronic devices when the blanking panels are in respective open positions.

Although shown without any electronic devices in FIG. 6, the cabinet 620 may be used to store various electronic devices. In some examples, the cabinet 620 may include a plurality of slots having devices with the blanking panels folded back, and a plurality of slots with no devices and the blanking panels in the closed position as shown in FIG. 6.

Figure 7A:
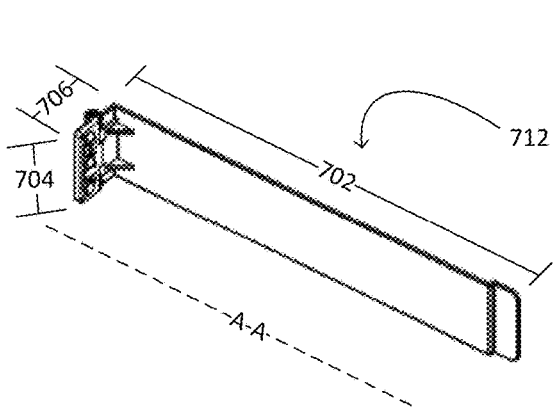
FIGS. 7A-7B are perspective views of an example fold away blanking panel in accordance with one or more techniques of the disclosure.
Figure 7B:
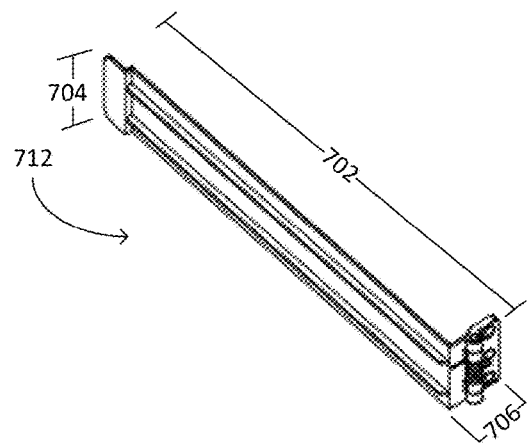
Figure 7C:
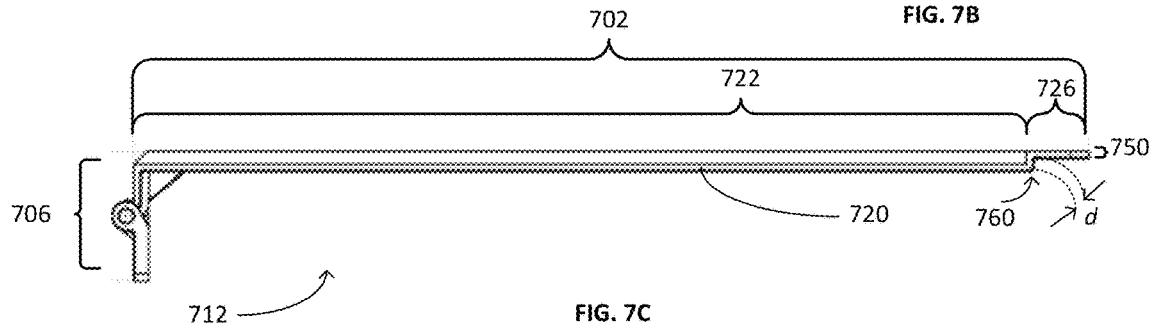
FIGS. 7C-7D are side views of the example fold away blanking panel shown in FIGS. 7A-7B.
Figure 7D:
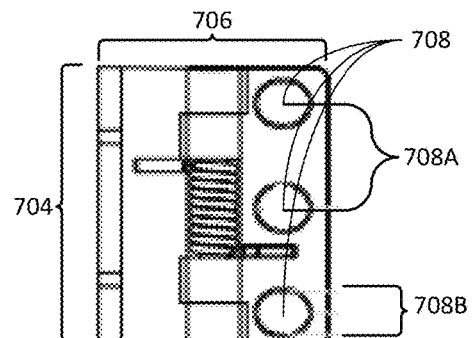
Figure 7E:
FIG. 7E is a bottom view of the example fold away blanking panel shown in FIGS. 7A-7D.

FIGS. 7A-7E illustrate an example fold away blanking panel 712. FIGS. 7A and 7B are perspective views of fold away blanking panel 712. FIG. 7C is a side view of fold away blanking panel 712 taken parallel to reference line A-A in FIG. 7A. FIG. 7D is a side view of fold away blanking panel taken perpendicular to reference line A-A in FIG. 7A. FIG. 7E is a bottom view of fold away blanking panel 712 taken perpendicular to reference line A-A in FIG. 7A. Blanking panel 712 may be an example instance of other panels described herein, such as blanking panels 512A, 512B.

In some examples, fold away blanking panel 712 may include plastic as a material of construction. In some examples, fold away blanking panel 712 may include nylon as a plastic material of construction. In some examples, fold away blanking panel 712 may include another plastic as a material of construction, such as polypropylene, polycarbonate, polyvinyl chloride (PVC), acrylonitrile butadiene styrene (ABS), or the like. In some examples, fold away blanking panel 712 may include other materials of construction, such as fiberglass, composite, or metal. Plastic may be advantageous as a material of construction for fold away blanking panel 712 relative to other materials because plastic may be relatively easy to manufacture, is inexpensive, lightweight, and provides improved insulation between hot aisles and cold aisles of a data center in contrast to metal, for instance.

Referring to FIG. 7C, fold away blanking panel 712 may include panel body 720. Panel body 720 may define step 760. Step 760 may be defined anywhere along length 702 of panel body 720. Step 760 may comprise two substantially 90 degree bends in panel body 720, defining offset depth d. In some examples, offset depth d may be approximately equal to panel body thickness 750, allowing opposing fold away blanking panels to fit together snugly, like the opposing fold away blanking panels 512A and 512B illustrated in FIG. 3B, which may allow the panels 512A, 512B to be substantially parallel and flush across the front opening of cabinet. In some examples, offset depth d may be more or less than panel body thickness 750 to provide depth for a connecting mechanism (e.g., connecting mechanisms 516A, 516B) while still allowing opposing fold away blanking panels to fit together to be substantially parallel and flush across the front opening of cabinet. The top surface of panel body 720 may define portion 722 on one side of step 760 and portion 726 on the other side of step 760.

Fold away blanking panel 712 may define length 702, which may correspond to a width dimension of a cabinet. In some examples, length 702 may be about 259.06 mm. In other examples, length 702 may be any other suitable length. Length 702 may be the total length of the panel body 720 of the fold away blanking panel 712. In other words, length 702 may be the length of portion 722, plus the length of portion 726. Length 702 may be that of any of panels 512A, 512B.

Fold away blanking panel 712 may define height 704. In some examples, height 704 may be about 43.12 mm. In other examples, height 704 may be any suitable width. Height 704 may be that of any of panels 512A, 512B.

Fold away blanking panel 712 may define length 706, which may correspond to a depth dimension of a cabinet. In some examples, length 706 may be about 34.93 mm. In other examples, length 706 may be any suitable length.

In some examples, fold away blanking panel 712 may define bracket holes 708. In some examples, there may be three bracket holes 708. In other examples, there may be any other suitable number of bracket holes 708. Bracket holes 708 may define distance between centers 708A. In some examples, distance between centers 708A may be 16 mm. In other examples, distance between centers 708A may be any other suitable distance. Bracket holes 708 may define hole diameter 708B. In some examples, hole diameter 708B may be 6.37 mm. In other examples, hole diameter 708B may be any other suitable diameter.

Figure 8:
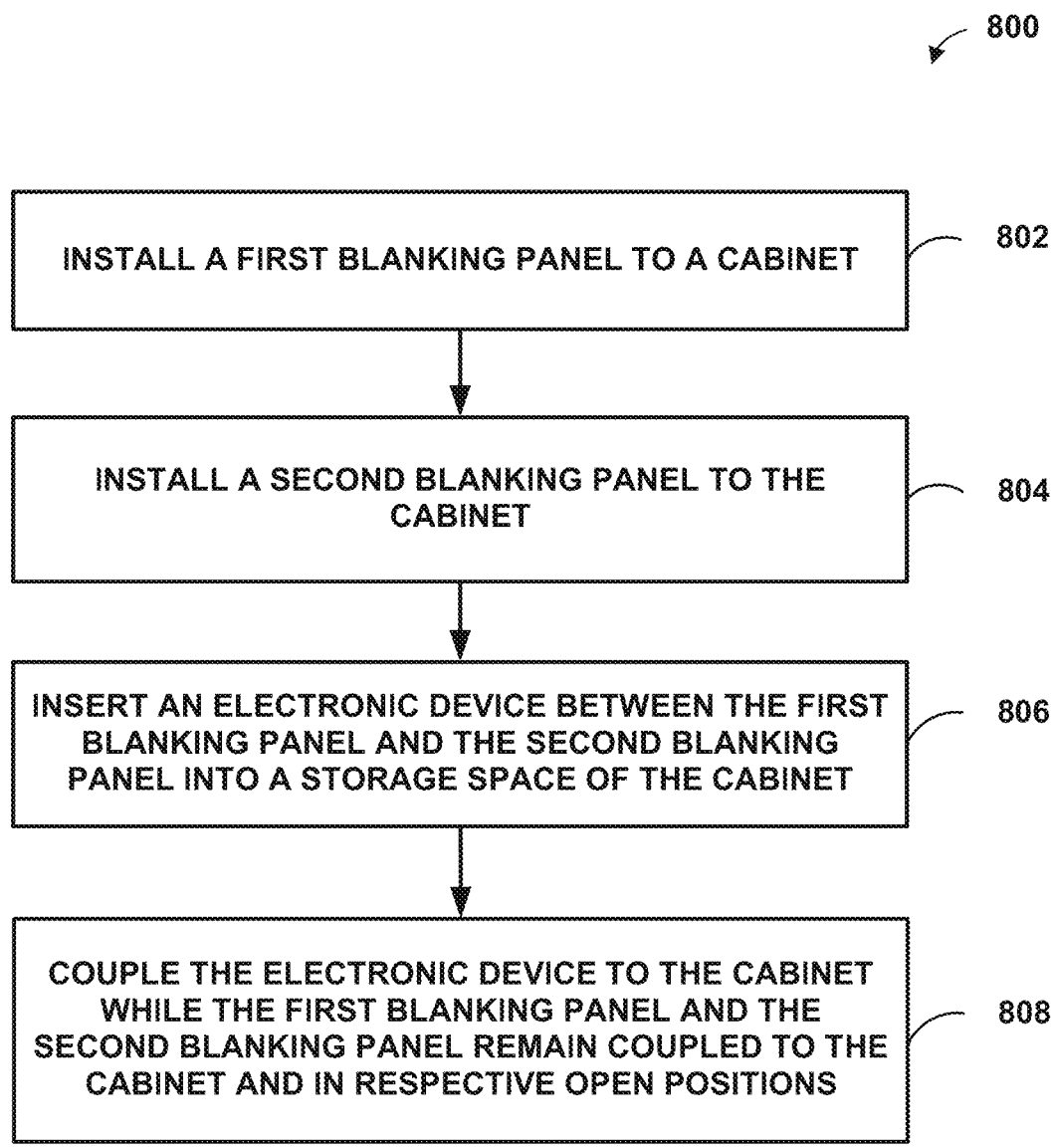
FIG. 8 is a flowchart illustrating an example method of installing a first blanking panel, a second blanking panel, and an electronic device to a cabinet in accordance with aspects of this disclosure.

FIG. 8 is a flowchart illustrating an example method of installing a first blanking panel, a second blanking panel, and an electronic device to a cabinet in accordance with aspects of this disclosure. The method 800 of FIG. 8 will be described with reference to FIGS. 3-5. While the steps of method 800 are described as occurring in a specific order in reference to FIG. 8, the order of steps is not limited to this example. For example, in some examples, the electronic device may be removed after coupling the electronic device (808), resulting in blanking panel 512A and blanking panel 512B rotating back to respective non-deployed positions.

The technique illustrated in FIG. 8 includes installing first blanking panel 512A configured to be affixed to a cabinet (802). For example, first blanking panel 512A may be attached to frame 530. First blanking panel 512A may include first spring-loaded hinge 514A and first connecting mechanism 516A.

The technique illustrated in FIG. 8 includes installing second blanking panel 512B configured to be affixed to the cabinet (804). Second blanking panel 512B may include second spring-loaded hinge 514B and second connecting mechanism 516B. In some examples, first and second connecting mechanisms 516 are configured to connect first blanking panel 512A with second blanking panel 512B in a closed position when first and second spring-loaded hinges 514 are in a non-deployed position. For example, blanking panel 512B may include a magnetic region configured to connect blanking panel 512A with blanking panel 512B in the closed position.

The technique illustrated in FIG. 8 includes inserting an electronic device between first blanking panel 512A and second blanking panel 512B into a storage space of the cabinet (806). For example, server 534 may be is inserted into the storage space between the blanking panel 512A and the blanking panel 512B, such as slot 532 of frame 530. In some examples, each of the first and second spring-loaded hinges 514 is configured to rotate from the non-deployed position to a deployed position in response to insertion of the electronic device. In some examples, first blanking panel 512A and second blanking panel 512B are configured to be out of contact with each other and into respective open positions when the first and second spring-loaded hinges 514 are in the deployed position.

The technique illustrated in FIG. 8 further includes coupling the electronic device to the cabinet while first blanking panel 512A and second blanking panel 512B remain affixed to the cabinet and in the respective open positions (808).

Although the foregoing examples have been illustrated as being used to allow configuration and reconfiguration of customer cages in a data center colocation space, the assembly may be used in a variety of different applications requiring blanking systems.

What is claimed is:

1. A system comprising:
a first blanking panel configured to be affixed to a cabinet, wherein the first blanking panel comprises:
a first spring-loaded hinge, and
a first connecting mechanism; and
a second blanking panel configured to be affixed to the cabinet, wherein the second blanking panel comprises:
a second spring-loaded hinge, and
a second connecting mechanism,
wherein the first blanking panel has a panel body comprising:
a first portion comprising a first surface and defining a longitudinal axis;
a second portion disposed at an end of the panel body and comprising a second surface at a nonzero angle with respect to the longitudinal axis; and
a third portion disposed at another end of the panel body and comprising a third surface substantially parallel with respect to the longitudinal axis;
wherein each of the first and second spring-loaded hinges is configured to rotate between a non-deployed position and a deployed position, wherein the second connecting mechanism comprises at least one magnetic region configured to overlap with the third portion, wherein the first and second connecting mechanisms are configured to connect the first blanking panel with the second blanking panel in a closed position when the first and second spring-loaded hinges are in the non-deployed position, wherein the first and second connecting mechanisms connect to one another in the closed position in order to connect the first blanking panel with the second blanking panel, and wherein the first blanking panel and the second blanking panel are configured to be out of contact with each other and into respective open positions when the first and second spring-loaded hinges are in the deployed position.

2. The system of claim 1, wherein each of the spring-loaded hinges are configured to rotate from the non-deployed position to the deployed position in response to an inward force applied to the first and second blanking panels that pushes the first and second blanking panels inwards and apart into the cabinet.

3. The system of claim 1, wherein when the first and second spring-loaded hinges are in the deployed position and the first and second blanking panels are in the respective open positions:
the first blanking panel is at about a 90-degree angle relative to when the first blanking panel was in the closed position,
the second blanking panel at about a 90-degree angle relative to when the second blanking panel was in the closed position,
such that an electronic device can be inserted into a storage space between the first blanking panel and the second blanking panel while the first and second blanking panels are in the respective open positions.

4. The system of claim 3, wherein the first and second blanking panels are configured to be held in respective open positions when the electronic device is inserted into the storage space between the first blanking panel and the second blanking panel.

5. The system of claim 3, wherein the first and second spring-loaded hinges are configured to automatically revert the first and second blanking panels from the open positions to the closed position when the electronic device is removed from the storage space between the first blanking panel and the second blanking panel.

6. The system of claim 1, wherein the at least one magnetic region is a first at least one magnetic region, and wherein the first connecting mechanism comprises a second at least one magnetic region.

7. The system of claim 1, wherein the at least one magnetic region includes a magnet attached to the second blanking panel, wherein the magnet magnetically couples to a metal portion of the first blanking panel.

8. The system of claim 1 wherein the panel body comprises a first corresponding panel body of the first blanking panel, wherein the second blanking panel has a second corresponding panel body, wherein the second corresponding panel body comprises:
- a first portion comprising a first surface and defining a longitudinal axis,
- a second portion disposed at an end of the second corresponding panel body and comprising a second surface perpendicular with respect to the longitudinal axis, and
- a third portion disposed at another end of the second corresponding panel body and comprising a third surface parallel with respect to the longitudinal axis.

9. The system of claim 8, wherein the third surface of the first blanking panel is positioned against the third surface of the second blanking panel when the first and second spring-loaded hinges are in the non-deployed position.

10. The system of claim 8, wherein the first connecting mechanism is located at an outer side of the third portion of the first blanking panel, and wherein the second connecting mechanism is located at an inner side of the third portion of the second blanking panel.

11. The system of claim 8, wherein each of the corresponding panel bodies has a length of about 230.1875 millimeters.

12. The system of claim 8, wherein each of the corresponding panel bodies has a thickness of about 31.06 millimeters.

13. The system of claim 8, wherein the first portion has a length of about 236.5 millimeters, the second portion has a length of about 31.06 millimeters, and the third portion has a length of about 15.63 millimeters.

14. A system comprising:
a cabinet; and
one or more pairs of blanking panels, wherein each pair of blanking panels of the one or more pairs of blanking panels comprises:
- a first blanking panel affixed to the cabinet, wherein the first blanking panel comprises:
  - a first spring-loaded hinge, and
  - a first connecting mechanism; and
- a second blanking panel affixed to the cabinet, wherein the second blanking panel comprises:
  - a second spring-loaded hinge, and
  - a second connecting mechanism,
wherein the first blanking panel has a panel body comprising:
- a first portion comprising a first surface and defining a longitudinal axis;
- a second portion disposed at an end of the panel body and comprising a second surface, at a nonzero angle with respect to the longitudinal axis; and
- a third portion disposed at another end of the panel body and comprising a third surface substantially parallel with respect to the longitudinal axis;
wherein each of the first and second spring-loaded hinges are configured to rotate between a non-deployed position and a deployed position, wherein the second connecting mechanism comprises at least one magnetic region configured to overlap with the third portion, wherein the first and second connecting mechanisms are configured to connect the first blanking panel with the second blanking panel in a closed position when the first and second spring-loaded hinges are in the non-deployed position, wherein the first and second connecting mechanisms connect to one another in the closed position in order to connect the first blanking panel with the second blanking panel, and wherein the first blanking panel and the second blanking panel are configured to be out of contact with each other and into respective open positions when the first and second spring-loaded hinges are in the deployed position.

15. The system of claim 14, where in one or more pairs of blanking panels are arranged along a longitudinal axis of the cabinet.

16. The system of claim 14, wherein a storage space of the cabinet is accessible when the first and second spring-loaded hinges are in the deployed position.

17. The system of claim 14, wherein a storage space of the cabinet is inaccessible when the first and second spring-loaded hinges are in the non-deployed position.

18. A method comprising:
installing a first blanking panel configured to be affixed to a cabinet, wherein the first blanking panel comprises a first spring-loaded hinge and a first connecting mechanism, wherein the first blanking panel has a panel body comprising:
- a first portion comprising a first surface and defining a longitudinal axis;
- a second portion disposed at an end of the panel body and comprising a second surface, at a nonzero angle with respect to the longitudinal axis; and
- a third portion disposed at another end of the panel body and comprising a third surface substantially parallel with respect to the longitudinal axis;
installing a second blanking panel configured to be affixed to the cabinet, wherein the second blanking panel comprises a second spring-loaded hinge and a second connecting mechanism, wherein the second connecting mechanism comprises at least one magnetic region configured to overlap with the third portion,
wherein the first and second connecting mechanisms are configured to connect the first blanking panel with the second blanking panel in a closed position when the first and second spring-loaded hinges are in a non-deployed position, and wherein the first and second connecting mechanisms connect to one another in the closed position in order to connect the first blanking panel with the second blanking panel;
inserting an electronic device between the first blanking panel and the second blanking panel into a storage space of the cabinet, wherein each of the first and second spring-loaded hinges is configured to rotate from the non-deployed position to a deployed position in response to insertion of the electronic device, wherein the first blanking panel and the second blanking panel are configured to be out of contact with each other and into respective open positions when the first and second spring-loaded hinges are in the deployed position; and
affixing the electronic device to the cabinet while the first blanking panel and the second blanking panel remain affixed to the cabinet and in the respective open positions.

19. The method of claim 18, further comprising:
removing the electronic device from the storage space between be first blanking panel and the second blanking panel, wherein each of the first and second spring-loaded hinges is configured to rotate from the deployed position back to the non-deployed position in response to removal of the electronic device.

20. The system of claim 1,
wherein the longitudinal axis comprises a first longitudinal axis, wherein the panel body defines a second longitudinal axis,
wherein the first spring-loaded hinge is connected to the panel body at an opposite end of the panel body, with respect to the second longitudinal axis, from where the first connecting mechanism is connected to the panel body,
wherein the second blanking panel comprises a second panel body defining a third longitudinal axis,
wherein the second spring-loaded hinge is connected to the second panel body at an opposite end of the second panel body, with respect to the third longitudinal axis, from where the second connecting mechanism is connected to the second panel body.

\* \* \* \* \*